United States Patent [19]

Lai et al.

[11] Patent Number: 4,475,982
[45] Date of Patent: Oct. 9, 1984

[54] DEEP TRENCH ETCHING PROCESS USING $CCl_2F_2/AR$ AND $CCl_2F_2/O_2$ RIE

[75] Inventors: Fang-shi J. Lai, Peekskill; Ronald N. Schulz, Salt Point, both of N.Y.

[73] Assignee: International Business Machines Corporation, Armonk, N.Y.

[21] Appl. No.: 560,769

[22] Filed: Dec. 12, 1983

[51] Int. Cl.³ .................... H01L 21/306; B44C 1/22; C03C 15/00; C03C 25/06
[52] U.S. Cl. .................... 156/643; 156/628; 156/646; 156/651; 156/659.1; 156/657; 156/661.1; 156/662; 204/192 E; 252/79.1
[58] Field of Search ............... 156/628, 643, 644, 646, 156/651, 652, 657, 659.1, 662, 661.1, 345; 252/79.1; 204/192 E; 427/38, 39

[56] References Cited

PUBLICATIONS

IBM Technical Disclosure Bulletin, vol. 25, No. 8, Jan. 1983, Method for Forming Vertical Walled Trenches in Silicon Substrates Using Reactive Sputter Etching by J. S. Lechaton et al., pp. 408–409.
IBM Technical Disclosure Bulletin, vol. 22, No. 5, Oct. 1979, Reactive Ion Etching of Silicon by P. M. Schaible et al., p. 1819.
IBM Technical Disclosure Bulletin, vol. 21, No. 7, Dec. 1978, pp. 2814–2815, "Reactive Ion Etching of Silicon" by P. M. Schaible et al.
IBM Technical Disclosure Bulletin, vol. 22, No. 10, Mar. 1980, pp. 4516–4517, "Chromium as an RIE Etch Barrier" J. E. Hitchner et al.

*Primary Examiner*—William A. Powell
*Attorney, Agent, or Firm*—Thomas J. Kilgannon

[57] ABSTRACT

This invention relates to a process for forming deep trenches in semiconductor substrates by Reactive Ion Etching and more particularly relates to an etching process which prevents lateral etching or "blooming" in a heavily doped semiconductor region which is sandwiched by upper and lower lightly doped regions of semiconductor. Still more particularly it relates to an RIE process wherein the upper region is reactively ion etched in an atmosphere of $CCl_2F_2$ and argon to at least a portion of the thickness of the upper region and wherein any remaining thickness of the upper region, the heavily doped region and at least a portion of the lower region are reactively ion etched in an atmosphere of $CCl_2F_2$ and oxygen to provide a trench with uniform sidewalls.

20 Claims, 3 Drawing Figures

DEEP TRENCH ETCHING PROCESS USING CCL$_2$F$_2$/AR AND CCL$_2$F$_2$/O$_2$ RIE

DESCRIPTION

1. Technical Field

This invention relates to a process for forming deep trenches in semiconductor substrates by Reactive Ion Etching and more particularly relates to an etching process which prevents lateral etching or "blooming" in a heavily doped semiconductor region which is sandwiched by upper and lower lightly doped regions of semiconductor. Still more particularly it relates to an RIE process wherein the upper region is reactively ion etched in an atmosphere of CCl$_2$F$_2$ and argon to at least a portion of the thickness of the upper region and wherein any remaining thickness of the upper region, the heavily doped region and at least a portion of the lower region are reactively ion etched in an atmosphere of CCl$_2$F$_2$ and oxygen to provide a trench with uniform sidewalls.

2. Background Art

Reactive Ion Etching (RIE) is now a relatively well-known technique which finds wide utility in the fabrication of integrated circuits.

In the fabrication of semiconductor devices such as bipolar transistors, isolation of individual devices is provided for by an insulator such as silicon dioxide disposed in deep trenches which surround the individual devices. These trenches are usually formed in the semiconductor substrate by reactive ion etching after masking portions of the substrate surface with a material or materials which have etch rates sufficient to permit the trench to be etched to a desired depth. These considerations are well-known and materials such as silicon dioxide and silicon nitride are routinely used as masks. When the substrates being etched are made up of a single semiconductor material which is uniformly doped with the same dopant, the unmasked portions of the substrate may be subjected to reactive ion etching and trenches with uniform sidewalls are easily obtained. However, when the substrate to be etched is characterized by variations in doping which are required to produce a useful transistor device, reactively ion etching such a substrate can result in undercutting or "blooming" in a portion of the substrate which has a different doping level, for example, than that in the regions surrounding the above mentioned substrate portion. This is particularly so when trenches are to be etched in a substrate which contains a heavily doped region of semiconductor material sandwiched between regions of lightly doped semiconductor material and when the width of the trenches is 1.25 microns or less.

The lateral chemical attack or "blooming" of the heavily doped semiconductor region has been noted in the IBM Technical Disclosure Bulletin, Vol. 21, No. 7, Dec. 1978, p. 2814, in an article by P. M. Scharble et al. entitled "Reactive Ion Etching of Silicon." The lateral attack of the N+ subcollector layer in the structure of the article was eliminated by cooling the wafers during etching and simultaneously increasing the Cl$_2$ concentration to 20 percent in a Cl$_2$+argon gas mixture.

The use of Freon mixed with argon, helium or oxygen is well-known in the reactive ion etching art. Indeed, the sequential use of argon and oxygen in combination with CCl$_4$ has been shown in the IBM Technical Disclosure Bulletin, Vol. 27, No. 10, Mar. 1980 in an article entitled "Chromium as an RIE Etch Barrier" by J. E. Hitchner et al. However, in the article, Ar+CCl$_4$ is used to attack an aluminum/copper layer while O$_2$+CCl$_4$ is used to etch chromium. Thus, the article doesn't deal with the problem of "blooming" or lateral attack in heavily doped semiconductor layers which are sandwiched by adjacent layers of lightly doped semiconductor material.

In a known approach, structures like the sandwich just mentioned are subjected to etching in mixtures of CCl$_2$F$_2$+O$_2$ or SF$_6$+CCl$_2$ to etch the desired trench in a single step. Using these gases, when trench widths get smaller than 1.25 microns, lateral attack or "blooming" occurs which militates against achieving high density and allows voids in insulation when the resulting trenches are filled with insulating material.

It is, therefore, a principal object of this invention to provide a process for reactively ion etching deep trenches in semiconductor materials which have uniform sidewalls.

It is another object of this invention to provide a reactive ion etching process for semiconductor materials which eliminates lateral etching or "blooming" in semiconductor portions which have different doping levels than other portions.

Yet another object is to provide a reactive ion etching process in which the use of corrosive atmospheres is eliminated.

Still another object is to provide a reactive ion etching process which is applicable over a wide range of trench widths including widths of 1.25 microns and below.

BRIEF SUMMARY OF THE INVENTION

The present invention relates to a Reactive Ion Etching (RIE) process which is utilized to etch trenches having uniform sidewalls in semiconductor materials. The process utilizes well-known RIE apparatus and departs from the prior art in that it utilizes two different, noncorrosive gases to eliminate lateral etching or "blooming" in a heavily doped region of semiconductor material which is sandwiched between upper and lower lightly doped regions of semiconductor material. The gases are CCl$_2$F$_2$+argon and CCl$_2$F$_2$+oxygen. The former is used initially to etch an exposed portion of the upper lightly doped semiconductor substrate to at least a portion of the thickness of the lightly doped region. The latter is used, after evacuating the former, to etch through any remaining thickness of the upper region, through the heavily doped region and into at least a portion of another lightly doped region which lies below the heavily doped region. The process is not limited to any trench width but is particularly applicable to etching trenches having widths of approximately 1.25 microns and less.

These and other objects, features and advantages will be more apparent from the following more particular description of the preferred embodiments.

DESCRIPTION OF PREFERRED EMBODIMENTS

The process to be described in detail herein below utilizes standard Reactive Ion Etching (RIE) apparatus well-known to those skilled in that art.

Figure 1:
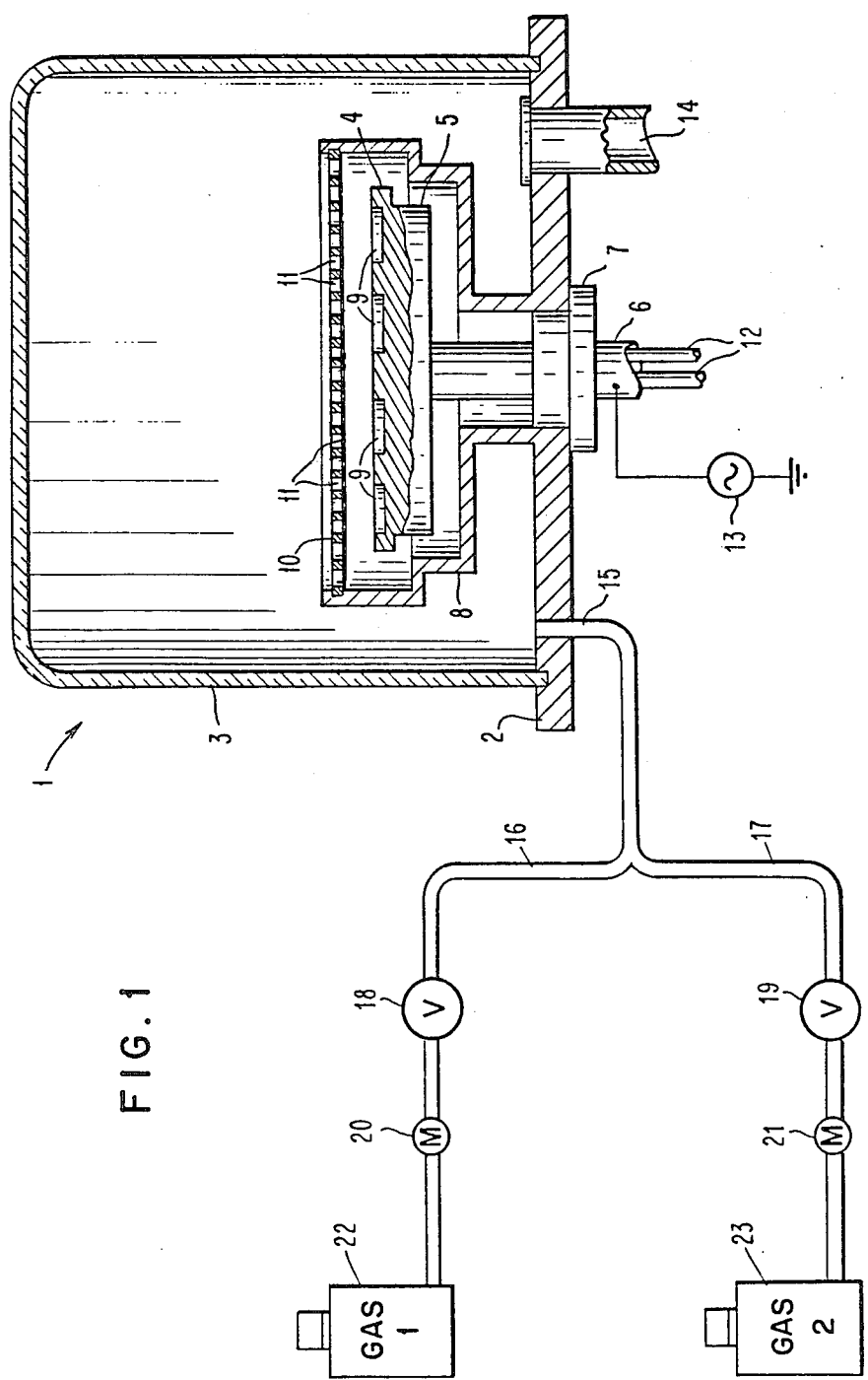
FIG. 1 is a partially schematic, cross-sectional drawing of reactive ion etching apparatus which may be utilized in the practice of the process to be described herein.

FIG. 1 shows a partially schematic cross-sectional view of Reactive Ion Etching apparatus which may be utilized in carrying out the process of the present invention. In FIG. 1, there is shown a vacuum housing 1 which includes a base plate 2 and a bell jar 3 which may be made of glass or metal and is hermetically sealed to base plate 2. A cathode plate 4 is shown disposed within bell jar 3 which is electrically and mechanically connected to a cathode 5.

In FIG. 1, cathode 5 is preferably a radio frequency electrode which is supported by an electrode support element 6 which passes through base plate 2 via a feedthrough insulator 7. Electrode support element 6 and feedthrough insulator 7 hold cathode 5 in substantially parallel relationship with base plate 2. A shield 8 extending from base plate 2 is spaced from and conformal with cathode plate 4, cathode 5 and electrode support element 6. A plurality of recesses 9 is shown disposed in the surface of cathode plate 4 into which substrates which are to be etched are receivable.

A perforated anode or catcher plate 10 is shown in FIG. 1 disposed opposite cathode plate 4 and supported by a portion of shield 8 on its periphery.

Perforated anode 10 partially confines the plasma developed during operation to the volume between perforated anode 10 and cathode 5. A diffuse glow, however, still fills the remaining volume of bell jar 3.

Cathode 5 which is usually made of copper is provided with a fluid conduit 12 for cooling cathode plate 4, if desired. A radio frequency power source 13 which provides power to the RIE system is shown connected between electrode support element 6 and ground.

Perforated anode or catcher plate 10 in addition to being mechanically connected to shield 8 is electrically at the same potential as shield 8 and is grounded. Anode plate 10 is preferably positioned about one inch away from cathode plate 4. To the extent that there is a tendency for the material of cathode plate 4 to sputter somewhat, anode plate 10 is used to intercept the sputtered material and prevent it from diffusing back onto the surface of the substrate being etched. Such sputtering can occur when cathode plate 4 is made of a metal such as aluminum, stainless steel or copper.

In FIG. 1, an exhaust pipe 14, which is used for evacuating the space enclosed by bell jar 3, is shown piercing base plate 2. Exhaust pipe 14 is connected to a vacuum pump (not shown). Bell jar 3 is evacuated prior to subjecting the substrate to be etched to the reactive ion etching process. Base plate 2 is also pierced by a conduit 15 which splits into conduits 16 and 17. Conduits 16, 17 are provided with variable leak valves 18, 19, respectively, and mass flow meters 20, 21, respectively. Each combination of leak valve and flow meter can be replaced by equipment which carries out the functions such as a flow controller. Mass flow meters and controllers are available commercially from Matheson under the trade designation Series 8240 and 8260 Mass Flow Controllers and from Tylan Corporation under the trade designation Model FM-300 and FM-302 Mass Flow Meter and Model FC-200 and FC-202 Mass Flow Controller. Mass flow meters and controllers actually measure molecular flow by volume by unit time such as standard cubic centimeters per minute. Conduit 16 is connected to a gas storage vessel 22 for one of the gases utilized in reactive ion etching while conduit 17 connects to gas storage vessel 23 for the other of the gases utilized.

In FIG. 1, substrates are normally disposed in recesses 9 in cathode plate 4 such that the surfaces of the substrates are flush with the surface of cathode plate 4.

Figure 2:
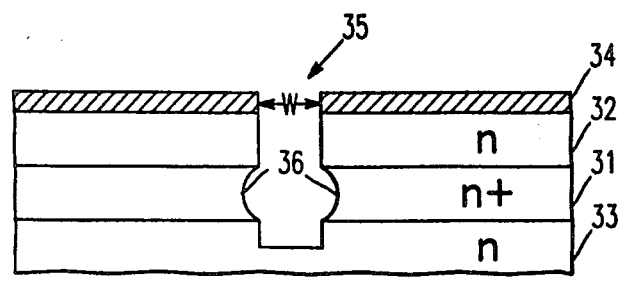
FIG. 2 is a cross-sectional view of a masked semiconductor substrate in which a trench has been formed by reactive ion etching. The substrate contains a heavily doped region sandwiched between two less heavily doped regions. Using prior art gas mixtures, such as $CCl_2F_2+O_2$ or $SF_6+CCl_2$, lateral etching or "blooming" occurs in the heavily doped region producing a trench with nonuniform sidewalls.

Referring now to FIG. 2, there is shown a partial cross-sectional schematic view of a semiconductor wafer or substrate 30 of silicon, for example, in which a heavily doped region or layer 31 of n+ conductivity type is sandwiched between lightly doped regions or layers 32, 33 of n-conductivity type. The surface of substrate 30 is covered with a masking layer 34 which may be a single layer of silicon dioxide deposited on the surface of substrate 30 or may be a composite layer of silicon dioxide overlying a layer of silicon nitride. Masking layer 34 may be made of any suitable material provided that it has an etch rate and thickness sufficient to permit etching a trench of desired depth in substrate 30 without removing all of masking layer 34.

A trench 35 is shown in FIG. 2 which extends through layers 31, 32 and partially into region 33. Using etchant gases like $CCl_2F_2+$oxygen or $SF_6+CCl_2$ in the RIE apparatus of FIG. 1, produces lateral etching or "blooming" at region 36 in heavily doped n+ layer 31 such that trench 35 has nonuniform sidewalls resulting in an undesirable lower density of devices permitted on a wafer and/or the existence of voids at region 36 when trench 35 is filled with insulating material. Using the prior art gases mentioned above provides relatively uniform sidewalls until the width, w, of the opening in masking layer 34 is required to be approximately 1.25 microns or less. At this point, severe lateral etching occurs in the heavily doped n+ layer 31 leading to the undesired density and void problems just mentioned.

Figure 3:
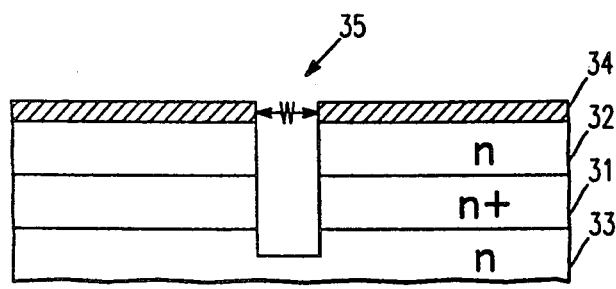
FIG. 3 is a cross-sectional view of a substrate like that shown in FIG. 2 in which a trench has been formed by reactive ion etching using gas mixtures of $CCl_2F_2+$argon and $CCl_2F_2+$oxygen in succession to first etch into an upper lightly doped region to a depth no greater than its thickness and then etch through any remaining thickness of the upper region and through a heavily doped region into at least a portion of a lower lightly doped region. The resulting trench has uniform sidewalls.

Referring now to FIG. 3, there is shown a partial, cross-sectional schematic view of a semiconductor wafer 30 which is identical in every way with wafer 30 of FIG. 2 except that trench 35 therein has uniform sidewalls and the lateral etching or "blooming" in n+ layer 31 has been eliminated.

Wafer or substrate 30 of FIG. 3 is initially prepared by ion implanting or diffusing an n-conductivity type dopant such as phorous or arsenic into an n-conductivity silicon wafer to form region or layer 31. The doping level ($1\times10^{19}$ cm$^{-3}$) in layer 31 is such that it is heavily doped characterized as n+ conductivity type. Subsequently, layer 32 of lightly doped n-conductivity type ($1\times10^{15}$ cm$^{-3}$) is epitaxially deposited using well-known techniques over region or layer 31. A masking layer of silicon dioxide 34 is formed on the surface of layer 32 by chemical vapor deposition or regrowth in a well-known way. Using well-known photolithographic masking and etching techniques, a portion of masking layer 34 is removed exposing a surface portion of layer 32 where a trench 35 is to be formed by reactive ion etching.

Wafers or substrates 30 are then disposed in recesses 9 in cathode plate 4 of the RIE apparatus shown in FIG. 1 and the apparatus is hermetically sealed by pumping down bell jar 3 with a pump (not shown) via exhaust pipe 14. Gas storage vessels 22,23 which are filled with $CCl_2F_2$+argon and $CCl_2F_2$+oxygen, respectively, can now be connected to the interior of vacuum housing 1 under control of valves 18, 19 and flow meters 20, 21.

Assuming that it is desired to reactively ion etch a trench 5 micron deep; that layer 32 is 3 micron thick; that layer 31 is 1 micron thick, that w is approximately 1.25 microns wide and that masking layer 34 is 5 microns thick, the following process steps are carried out:

In a first step, $CCl_2F_2$+argon is introduced into vacuum housing 1 and reactive ion etching is carried out under the following conditions:

| | | |
|---|---|---|
| (a) gas flow | 20 sccm | |
| (b) gas pressure | 20 microns | |
| (c) RIE power | 100 w | |
| (d) gas ratio (by volume) ($CCl_2F_2$:Ar = 50:50) | 1 | |

Under these conditions, layer 32 is etched approximately 0.5 microns deep.

In the above step, the gas flow may be in a range of 20-25 sccm; the gas pressure may be in a range of 18-23 microns and the RIE power may be 100 watts ±10% and similar results will be obtained.

In a second step, RIE is discontinued and the $CCl_2F_2$+argon is evacuated via exhaust pipe 14.

In a third step, $CCl_2F_2$+oxygen is introduced and RIE is carried out under the following conditions:

| | | |
|---|---|---|
| (a) gas flow | 20 sccm | |
| (b) gas pressure | 20 microns | |
| (c) RIE power | 100 w | |
| (d) gas ratio (by volume) $CCl_2F_2 + O_2$ = 50:50 | 1 | |

Under the above conditions, layer 31 is etched through and a portion of layer 33 is etched. The sidewalls in trench 35 are uniform. In the last step, the gas flow may be in a range of 20-25 sccm. The gas pressure may be in a range of 18-23 microns and RIE power may be 100 watts ±10% and similar results will be obtained.

In connection with the depth of etch of epitaxial layer 32, it should be appreciated that this layer can be etched all the way through, and the lateral etching will be eliminated. However, this is not normally done inasmuch as it is not necessary to achieve the desired result. Preferably, at least a portion of layer 32 is etched. Typically for a 1 micrometer layer, the thickness etched can be 0.4 μm-0.6 μm. Of course, the thicker epitaxial layer 31 is, the greater will be the portion etched but normally is approximately less than half the thickness of layer 32.

Using the above steps, trenches with uniform sidewalls may be etched in semiconductor wafers. In a usual application, layer 31 is a region known as a subcollector layer and layer 32 is an epitaxial layer in which emitter, base and collector regions of a bipolar device are formed. The teaching of the present application however, is not limited to forming trenches for such specific applications but may be used in any layered structure which contains variations in the doping of the layers or regions.

While n-conductivity type dopants have been shown in the structure of FIG. 3, it should be appreciated that the process disclosed herein works equally well with p-conductivity type dopants. In addition, layer 33 of FIG. 3 may be p-conductivity type while the other layers or regions are n-conductivity type. Conversely, layer 33 may be n-conductivity type while the other layers are p-conductivity type.

Having thus described our invention, what we claim as new, and desire to secure by Letters Patent is:

1. A method of forming deep trenches with uniform sidewalls in a semiconductor structure wherein said structure includes a heavily doped region sandwiched between upper and lower lightly doped regions comprising the steps of:
   reactively ion etching said upper lightly doped region in an atmosphere of $CCl_2F_2$ and argon to at least a portion of the thickness of said upper region, and,
   subsequently reactively ion etching any remaining thickness of said upper region and said heavily doped region and at least a portion of said lower lightly doped region in an atmosphere $CCl_2F_2$ and oxygen.

2. A method according to claim 1 further including the step of masking the surface of said upper region to provide at least an exposed surface portion prior to reactive ion etching.

3. A method according to claim 1 wherein the step of reactively ion etching in an atmosphere of $CCl_2F_2$ and argon includes the steps of:
   introducing said atmosphere of $CCl_2F_2$ and argon into an evacuated reactive ion etching reactor at a pressure in the range of 18-23 microns, at a flow in the range of 20-25 standard cubic centimeters per minute and at a gas ratio (by volume) of $CCl_2F_2$ to argon of 1, and,
   applying power in a range of 90-110 watts to said reactor.

4. A method according to claim 1 wherein the step of reactively ion etching in an atmosphere of $CCl_2F_2$ and oxygen includes the step of:
   introducing said atmosphere of $CCl_2F_2$ and oxygen into said evacuated reactive ion etching reactor at a pressure in the range of 18-23 microns, at a flow in the range of 20-25 standard cubic centimeters per minute and at a gas ratio (by volume) of $CCl_2F_2$ to oxygen of 1, and,
   applying power in a range of 90-110 watts to said reactor.

5. A method according to claim 1 wherein said semiconductor is silicon, said heavily doped region and said upper region are doped with an n-conductivity type dopant and said lower region is doped with a p-conductivity type dopant.

6. A method according to claim 1 wherein said semiconductor is silicon, said heavily doped region and said upper region are doped with a p-conductivity type dopant and said lower region is doped with an n-conductivity type dopant.

7. A method according to claim 1 wherein said semiconductor is silicon, said heavily doped region and said upper and lower regions are doped with an n-conductivity type dopant.

8. A method according to claim 1 wherein said semiconductor is silicon, said heavily doped region and said upper and lower regions are doped with a p-conductivity type dopant.

9. A method according to claim 1 wherein said heavily doped region is an ion implanted or diffused region.

10. A method according to claim 1 wherein said upper region is formed from an epitaxially deposited layer of semiconductor.

11. A method according to claim 2 wherein the step of masking includes the steps of forming at least a layer of masking material on said surface of said upper region, forming a layer of photoresist on said at least a layer of masking material and exposing at least a portion of said resist to radiation, and, developing said photoresist to remove said at least a portion of said layer of photoresist to provide said at least an exposed surface portion.

12. A method according to claim 11 wherein the step of forming at least a layer of masking material includes the step of depositing a layer of silicon nitride on said surface of said upper region.

13. A method according to claim 11 wherein the step of forming at least a layer of masking material includes the step of depositing a layer of silicon oxide on said surface of said upper region.

14. A method according to claim 12 further including the step of depositing a layer of silicon oxide on said layer of silicon nitride.

15. A method of forming deep trenches with uniform sidewalls in a semiconductor structure wherein said structure includes a heavily doped region sandwiched between upper and lower lightly doped regions comprising the steps of:

placing at least one of said structures in a reactive ion etching reactor, introducing an atmosphere of $CCl_2F_2$ and argon into said reactor at a pressure of 20 microns, at a flow of 20 standard cubic centimeters per minute and at a gas ratio (by volume) of $CCl_2F_2$ to argon of 1, applying power of 100 watts to said reactor, reactively ion etching said upper lightly doped region to a depth up to the thickness of said upper region, evacuating said reactor, introducing an atmosphere of $CCl_2$ and oxygen into said reactor at a pressure of 20 microns, at a flow of 20 standard cubic centimeters per minute and at a gas ratio (by volume) of $CCl_2F_2$ to oxygen of 1, applying power of 100 watts to said reactor, and, reactively ion etching said heavily doped region and at least a portion of said lower region.

16. A method according to claim 15 further including the step of masking the surface of said upper region prior to reactively ion etching to provide at least an exposed surface portion.

17. A method according to claim 16 wherein said semiconductor is silicon, said upper region is a layer of epitaxially deposited, n-conductivity type silicon, said lower region is a region of p-conductivity type silicon and said heavily doped region is a region of n-conductivity type silicon.

18. A method according to claim 16 wherein said semiconductor is silicon, said upper region is a layer of epitaxially deposited, p-conductivity type silicon, said lower region is a region of n-conductivity type silicon and said heavily doped region is a region of p-conductivity type silicon.

19. A method according to claim 16 wherein said semiconductor is silicon, said heavily doped region and said upper and lower regions are all regions of n-conductivity type silicon.

20. A method according to claim 16 wherein said semiconductor is silicon, said heavily doped region and said upper and lower regions are all regions of p-conductivity type silicon.

* * * * *